(12) United States Patent
Cho et al.

(10) Patent No.: US 12,439,770 B2
(45) Date of Patent: Oct. 7, 2025

(54) COVER WINDOW AND DISPLAY DEVICE INCLUDING THE SAME

(71) Applicant: Samsung Display Co., LTD., Yongin-si (KR)

(72) Inventors: Jong Hwan Cho, Ansan-si (KR); Su Jin Sung, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 565 days.

(21) Appl. No.: 17/852,081

(22) Filed: Jun. 28, 2022

(65) Prior Publication Data

US 2023/0082914 A1  Mar. 16, 2023

(30) Foreign Application Priority Data

Sep. 6, 2021  (KR) .......... 10-2021-0118198

(51) Int. Cl.
| | | |
|---|---|---|
| *H01L 51/52* | (2006.01) | |
| *H10K 50/84* | (2023.01) | |
| *H10K 50/858* | (2023.01) | |
| *H10K 50/86* | (2023.01) | |

(52) U.S. Cl.
CPC .......... *H10K 50/84* (2023.02); *H10K 50/858* (2023.02); *H10K 50/865* (2023.02)

(58) Field of Classification Search
CPC .... H10K 50/84; H10K 50/858; H10K 50/865; H10K 59/871; H10K 59/879; H10K 59/8792
See application file for complete search history.

(56) References Cited

U.S. PATENT DOCUMENTS

| | | | |
|---|---|---|---|
| 2015/0090991 A1* | 4/2015 | Ishii .................... | H10K 50/856 257/40 |
| 2016/0260869 A1* | 9/2016 | Jeon ...................... | H01L 33/38 |
| 2021/0047236 A1 | 2/2021 | Adib et al. | |

FOREIGN PATENT DOCUMENTS

| | | | |
|---|---|---|---|
| JP | 6561823 B2 | 6/2017 | |
| JP | 6843743 B2 | 10/2017 | |

* cited by examiner

*Primary Examiner* — Mohammed R Alam
(74) *Attorney, Agent, or Firm* — Womble Bond Dickinson (US) LLP

(57) ABSTRACT

An embodiment provides a cover window including: a window layer; a low refractive layer positioned on one surface of the window layer; an adhesive layer positioned on the low refractive layer; a wear resistance layer positioned on the adhesive layer; and a light blocking layer positioned on the other surface of the window layer, wherein the adhesive layer includes a substitutional solid solution of $SiO_2$ and $Al_2O_3$.

20 Claims, 9 Drawing Sheets

Cross-section SEM micrographs at T=250

FIG. 7

| Class | 5B | 4B | 3B | 2B | 1B | 0B |
|---|---|---|---|---|---|---|
| Peeling (%) | 0 | ~5 | 5~15 | 15~35 | 35~65 | 65~ |
| Example | | | | | | |

COVER WINDOW AND DISPLAY DEVICE INCLUDING THE SAME

CROSS-REFERENCE TO RELATED APPLICATION

This application claims priority to and the benefit of Korean Patent Application No. 10-2021-0118198, filed in the Korean Intellectual Property Office on Sep. 6, 2021, the entire content of which is incorporated herein by reference.

BACKGROUND

1. Field

The present disclosure relates to a cover window and a display device including the same.

2. Description of the Related Art

Recently one or more suitable mobile electronic devices, such as a portable phone, a navigation device, a digital camera, an electronic book, a portable game console, and/or one or more suitable kinds of terminals to which a liquid crystal display device or an organic light emitting diode display device is applied as a display device, have been utilized.

In a related art display device utilized in the mobile electronic devices, a cover window that is transparently formed (e.g., with a suitable transparency) so that a user may see a display part therethrough is provided at a front side of a display panel. Because the cover window is positioned at the outermost side of the display device, the cover window is desirable to be strong against external impact so as to protect the display panel and/or the like in the mobile electronic devices.

Moreover, instead of an existing manner in which a switch or a keyboard is utilized as an input device, recently, a structure where a touch panel integrated with a display screen has become widely utilized, and thus, compared to an existing mobile device, in many cases, because a surface of the cover window comes into contact with a finger and/or the like, the cover window is desired to have greater strength.

Further, recently, research on a flexible display device has been actively conducted, and it is preferable that a cover window applied to such a flexible display device is formed with a foldable member having suitable flexibility.

The cover window may include multiple layers to improve strength and flexibility, and in this structure, interface reflection may increase, and thus reflectivity of the cover window may increase.

The above information disclosed in this Background section is only for enhancement of understanding of the background of the present disclosure, and therefore it may contain information that does not form the prior art that is already known to a person of ordinary skill in the art.

SUMMARY

Aspects according to embodiments of the present disclosure are directed toward a cover window having low reflectivity and excellent or suitable durability, and a display device including the same.

According to an embodiment, a cover window includes: a window layer; a low refractive layer on a first surface of the window layer; an adhesive layer on the low refractive layer; a wear resistance layer on the adhesive layer; and a light blocking layer on a second surface of the window layer facing oppositely away from the first surface, wherein the adhesive layer includes a substitutional solid solution of $SiO_2$ and $Al_2O_3$.

The low refractive layer may be a single layer.

The low refractive layer may include $MgF_2$.

The $MgF_2$ in the low refractive layer may have a crystalline structure.

A thickness of the low refractive layer may be 50 nm to 150 nm.

A refractive index of the low refractive layer at a wavelength of 550 nm may be 1.5 or less.

The adhesive layer may include $Si_9Al_2O_{10}$.

A thickness of the adhesive layer may be 5 nm to 25 nm.

A refractive index of the adhesive layer at a wavelength of 550 nm may be 1.5 or less.

The wear resistance layer may include perfluoropolyether.

A thickness of the wear resistance layer may be 5 nm to 30 nm.

The light blocking layer may have a single-layered or multi-layered structure, and may include at least one of acrylic urethane, epoxy, polyester, or epoxy ester.

A thickness of the light blocking layer may be 8 μm to 15 μm.

The light blocking layer may include a first layer including acrylic urethane and a second layer including epoxy, a thickness of the first layer may be 3 μm to 8 μm, and a thickness of the second layer may be 5 μm to 10 μm.

The light blocking layer may include a first layer including polyester and a second layer including an epoxy ester, a thickness of the first layer may be 3 μm to 8 μm, and a thickness of the second layer may be 5 μm to 10 μm.

The light blocking layer may include a first layer including polyester, a second layer including polyester, and a third layer including epoxy ester, a thickness of the first layer may be 2 μm to 5 μm, a thickness of the second layer may be 3 μm to 5 μm, and a thickness of the third layer may be 3 μm to 5 μm.

The light blocking layer may be positioned only in a partial area of the window layer.

The light blocking layer may have heat resistance (e.g., may not peel off from the window layer or deteriorate in any aspects) at a temperature of 200° C. to 300° C.

A reflectance of the cover window may be 6.5% or less.

The display device according to the present embodiment may include the above-described cover window and a display panel overlapping the cover window.

According to one or more embodiments, a cover window having low reflectivity and excellent or suitable durability and a display device including the same are provided.

BRIEF DESCRIPTION OF THE DRAWINGS

FIG. 7 shows a grading system according to a peeling area in a tape detachment test.

DETAILED DESCRIPTION

Figure 1:
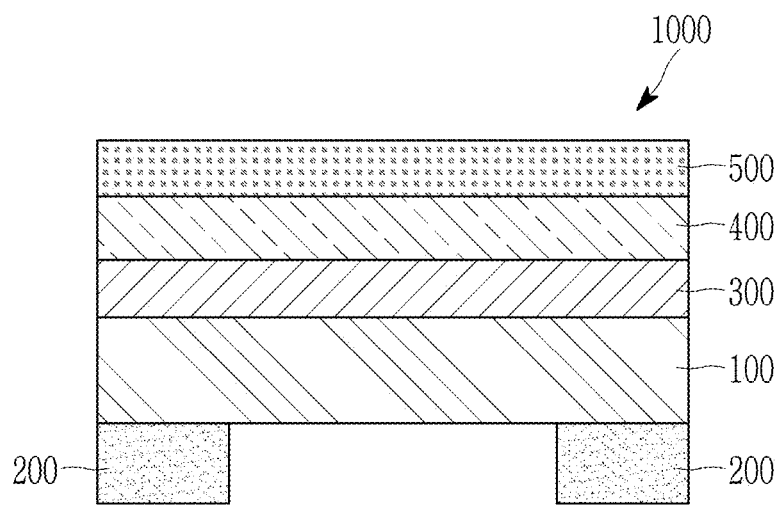
FIG. 1 illustrates a cross-sectional view of a cover window according to an embodiment.

The present disclosure will be described in more detail hereinafter with reference to the accompanying drawings, in which embodiments of the present disclosure are shown. As those skilled in the art would realize, the described embodiments may be modified in one or more suitable ways, all without departing from the spirit or scope of the present disclosure.

In order to clearly describe the present disclosure, parts or portions that are irrelevant to the description are omitted, and identical or similar constituent elements throughout the specification are denoted by the same reference numerals.

Further, in the drawings, the size and thickness of each element are arbitrarily illustrated for ease of description, and the present disclosure is not necessarily limited to those illustrated in the drawings. In the drawings, the thicknesses of layers, films, panels, regions, areas, etc., may be exaggerated for clarity. In the drawings, for ease of description, the thicknesses of some layers and areas may be exaggerated.

It will be understood that when an element such as a layer, film, region, area, or substrate is referred to as being "on" another element, it can be directly on the other element or intervening elements may also be present. In contrast, when an element is referred to as being "directly on" another element, there are no intervening elements present. Further, in the specification, the word "on" or "above" refers to positioned on or below the object portion, and does not necessarily refer to positioned on the upper side of the object portion based on a gravitational direction.

In some embodiments, unless explicitly described to the contrary, the word "include," "comprise," and variations such as "includes," "comprises," "including" or "comprising" will be understood to imply the inclusion of the stated elements but not the exclusion of any other elements.

Further, throughout the specification, the phrase "in a plan view" or "on a plane" refers to viewing a target portion from the top, and the phrase "in a cross-sectional view" or "on a cross-section" refers to viewing a cross-section formed by vertically cutting a target portion from the side.

Hereinafter, a cover window according to an embodiment and a display device including the same will be described in more detail with reference to the accompanying drawings.

FIG. 1 illustrates a cross-sectional view of a cover window 1000 according to an embodiment. Referring to FIG. 1, the cover window 1000 according to the present embodiment includes a window layer 100, a light blocking layer 200 positioned on a rear surface of the window layer 100, a low refractive layer 300 positioned on the other surface (e.g., the front surface) of the window layer 100, an adhesive layer 400 positioned on the low refractive layer 300, and a wear resistance layer 500 positioned on the adhesive layer 400.

The cover window 1000 according to the present embodiment is characterized in that reflectance is reduced, and the low refractive layer 300 is formed of a single layer to improve durability. Hereinafter, each constituent element will be described in more detail.

The window layer 100 may include glass or a polymer. An example of the polymer may include polyimide, but the present disclosure is not limited thereto. In an embodiment, the window layer 100 may be made of glass.

The low refractive layer 300 is positioned on one surface of the window layer 100. The low refractive layer 300 may reduce the reflectance of the cover window. A refractive index of the low refractive layer 300 with respect to a wavelength of 550 nm may be 1.5 or less.

When a lot of surface reflection occurs in the display device including the cover window 1000, the total reflectance of the display device may increase, and display quality may deteriorate. In a display device, most of the reflection occurs on the surface of the cover window 1000, so it is desirable to reduce the reflectance of the cover window 1000. The cover window 1000 according to the present embodiment may include the low refractive layer 300 to reduce the reflectance of the cover window 1000.

In the present embodiment, the low refractive layer 300 may be a single layer (e.g., formed in a single deposition process with a substantially uniform composition). When the low refractive layer 300 is a single layer, a wear resistance characteristic may be improved and a cost may be reduced compared with a multi-layered low refractive layer.

For example, when a high refractive layer and a low refractive layer are alternately stacked to reduce reflectance, they may be vulnerable to external impacts and scratches. In some embodiments, peeling may occur between the stacked high refractive layer and low refractive layer. Likewise, when the low refractive layer is formed in a multi-layered structure, it may be vulnerable to external impacts and scratches, and peeling between respective layers may occur.

However, in the case of the cover window according to the present embodiment, because the low refractive layer 300 is a single layer, it may have excellent or suitable mechanical characteristics while reducing the reflectance of the cover window.

In the present embodiment, the low refractive layer 300 may include a material having a refractive index of 1.5 or less. The low refractive layer 300 may include fluorine.

For example, the low refractive layer 300 may include $MgF_2$. In this case, the $MgF_2$ included in the low refractive layer 300 may have a crystalline structure.

Figure 2:
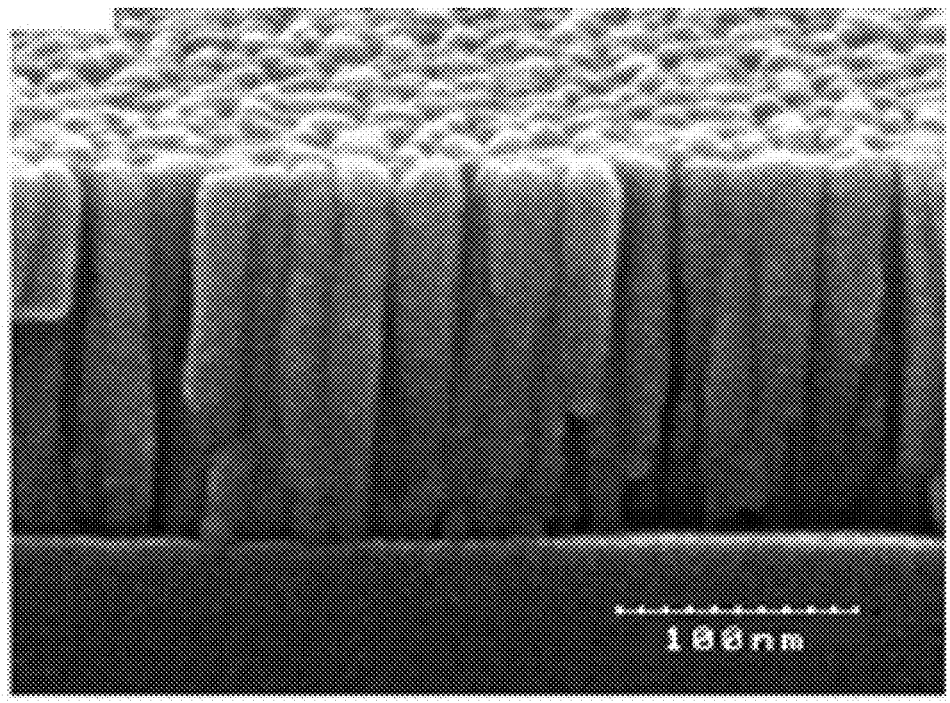
FIG. 2 illustrates an SEM image of $MgF_2$ included in a low refractive layer of a cover window according to an embodiment.

FIG. 2 illustrates a scanning electron microscopy (SEM) image of the $MgF_2$ (formed at a temperature of 200° C.) included in the low refractive layer 300 of the cover window 1000 according to the present embodiment. As shown in FIG. 2, in the present embodiment, the $MgF_2$ included in the low refractive layer 300 may have a crystalline structure.

In order for the $MgF_2$ to have the crystalline structure, the $MgF_2$ may be formed at a temperature of 200° C. to 300° C. When the crystal of the $MgF_2$ is grown at a temperature of 200° C. to 300° C., the $MgF_2$ has the desirable crystalline structure, and adhesion between the $MgF_2$ and the window layer 100 may be improved.

A refractive index of the $MgF_2$ with respect to a wavelength of 550 nm is 1.38, which may effectively reduce the reflectance of the cover window.

A thickness of the low refractive layer 300 may be 50 nm to 150 nm. When the thickness of the low refractive layer 300 is less than 50 nm, an effect of reducing the reflectance may not be sufficient (e.g., may not be large). When the thickness of the low refractive layer 300 exceeds 150 nm, because the thickness of the cover window becomes too thick, it may not be appropriate or suitable to be applied to a foldable display device, and transmittance of the cover window may deteriorate.

The low refractive layer 300 according to the present embodiment contains fluorine, and in this case, it may not have sufficient bonding strength with other layers. Accordingly, the cover window according to the present embodiment may include the adhesive layer 400 for attaching the low refractive layer 300 and the wear resistance layer 500.

The adhesive layer 400 may include $SiO_2$ and $Al_2O_3$. In this case, the $SiO_2$ and $Al_2O_3$ in the adhesive layer 400 may exist as a substitutional solid solution. For example, the $SiO_2$ and the $Al_2O_3$ may not be respectively included, but elements of $SiO_2$ and $Al_2O_3$ may be substituted with each other in the structure to form a crystal structure. For example, it may exist in a state of $Si_9Al_2O_{10}$.

Figure 3:
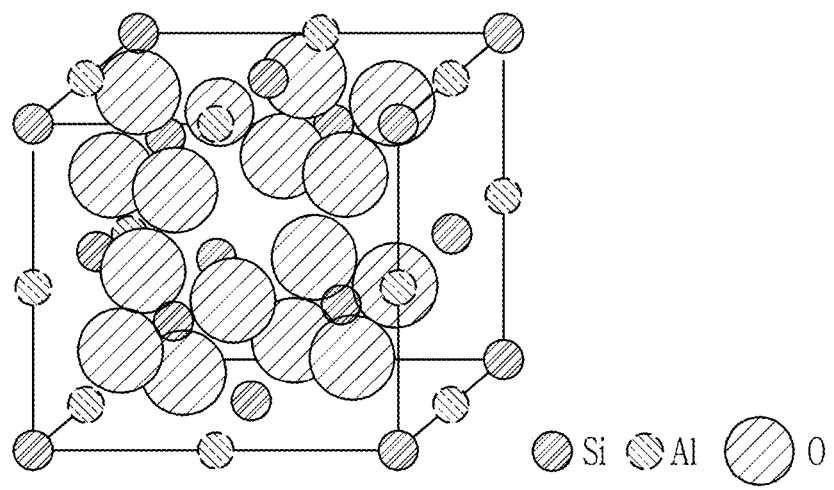
FIG. 3 illustrates a crystal structure of $Si_9Al_2O_{10}$ included in an adhesive layer.

FIG. 3 illustrates a crystal structure of the $Si_9Al_2O_{10}$. As shown in FIG. 3, Si, Al, and O may have (e.g., form) a crystal structure in the adhesive layer 400.

The refractive index of the adhesive layer 400 including a substitutional solid solution of $SiO_2$ and $Al_2O_3$ at a wavelength of 550 nm may be 1.48. Therefore, the adhesive layer 400 may also contribute to the reduction of the reflectance of the cover window.

A thickness of the adhesive layer 400 may be 5 nm to 25 nm. When the thickness of the adhesive layer 400 is less than 5 nm, the adhesive performance may decrease, and when the thickness of the adhesive layer 400 exceeds 25 nm, the transmittance may decrease.

Referring back to FIG. 1, the wear resistance layer 500 is positioned on a surface of the cover window, and may suppress or reduce wear on the surface. For example, the wear resistance layer 500 may include perfluorinated polyether (PFPE). The PFPE has a rigid, short perfluoroalkyl chain with a highly flexible ether linkage introduced therein. Therefore, it may have soft amorphous properties, excellent or suitable anti-fingerprint properties, and excellent or suitable slip properties.

The refractive index at a wavelength of 550 nm of the wear resistance layer 500 including the PFPE may be 1.32. Therefore, the wear resistance layer 500 may also contribute to the reduction of the reflectance of the cover window.

A thickness of the wear resistance layer 500 may be 5 nm to 30 nm. When the thickness of the wear resistance layer 500 is less than 5 nm, it may not have sufficient wear resistance. When the thickness of the wear resistance layer 500 exceeds 30 nm, transmittance may be deteriorated.

The light blocking layer 200 may be positioned along an edge of the cover window. The light blocking layer 200 may prevent or reduce or substantially prevent or reduce wires or circuits positioned on the display panel from being viewed from the outside, and may prevent or reduce light leakage of the display panel. A portion in which the light blocking layer 200 is disposed may be a bezel area of the display device.

The light blocking layer 200 of the present embodiment may have heat resistance that may withstand a deposition temperature for the formation of the low refractive layer 300, the adhesive layer 400, and the wear resistance layer 500 on the window layer 100. For example, the low refractive layer 300, the adhesive layer 400, and the wear resistance layer 500 may be formed by utilizing E-beam, and in this case, a process temperature may be 200° C. to 300° C. For example, it may be 250° C. Accordingly, it is preferable that the light blocking layer 200 has heat resistance such that it does not lose adhesion to the window layer 100 at a temperature of 200° C. to 300° C.

The light blocking layer 200 according to the present embodiment may have heat resistance at 200° C. to 300° C. without loss of adhesion. Accordingly, in the state in which the light blocking layer 200 is positioned on the window layer 100, the low refractive layer 300, the adhesive layer 400, and the wear resistance layer 500 may be formed. The low refractive layer 300, the adhesive layer 400, and the wear resistance layer 500 may be continuously formed in one chamber, thereby simplifying the process. For example, when the light blocking layer 200 does not have sufficient heat resistance, the low refractive layer 300, the adhesive layer 400, the wear resistance layer 500, and/or the like in which a high temperature process is required, are first formed on the window layer 100, and then the light blocking layer 200 is formed under the window layer 100 by a separate process. In this case, the process time is long and economical efficiency is lowered. However, in the present embodiment, because the light blocking layer 200 has suitable heat resistance, the E-beam process for forming the low refractive layer 300, the adhesive layer 400, and the wear resistance layer 500 may be performed in the state in which the light blocking layer 200 is formed on the window layer 100. This E-beam process may be continuously performed in one chamber, thereby simplifying the process.

A thickness of the light blocking layer 200 may be 8 μm to 15 μm. When the thickness of the light blocking layer 200 is less than 8 μm, light leakage may occur, and when the thickness of the light blocking layer 200 is more than 15 μm, a step (e.g., a difference in thickness) between a formation area and a non-formation area of the light blocking layer 200 increases, which may be undesirable.

The light blocking layer 200 may have a single-layered or multi-layered structure, and may include at least one of acrylic urethane, epoxy, polyester, and epoxy ester.

Although the embodiment in which the light blocking layer 200 has a single-layered structure is illustrated in FIG. 1, the light blocking layer 200 may have a multi-layered structure, for example, a two- or three-layered structure.

Figure 4:
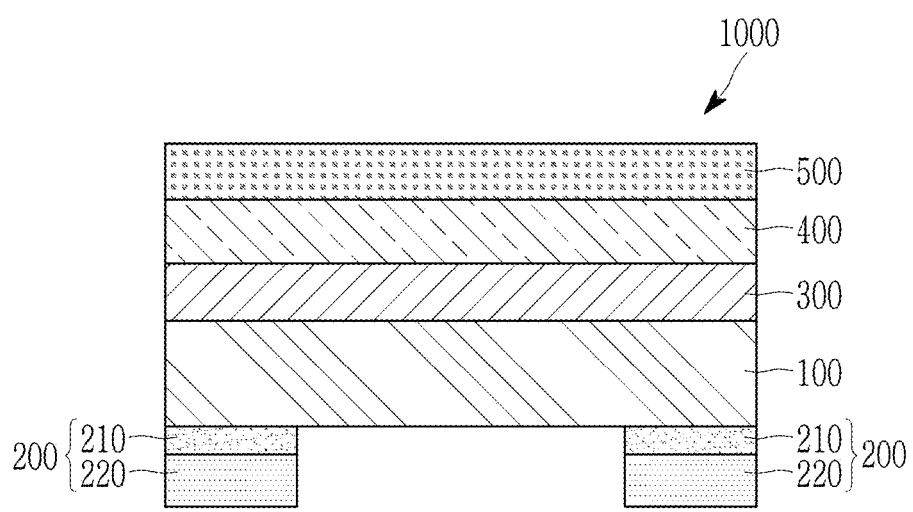
FIG. 4 illustrates a cross-sectional view of a cover window according to another embodiment.

FIG. 4 illustrates a cover window according to another embodiment.

Referring to FIG. 4, the cover window according to the present embodiment is the same as in the embodiment of FIG. 1, except that the light blocking layer 200 includes a first layer 210 and a second layer 220. Detailed description of the same constituent elements will not be provided.

Referring to FIG. 4, the first layer 210 may include acrylic urethane, and the second layer 220 may include epoxy. In some embodiments, the first layer 210 may include polyester, and the second layer 220 may include epoxy. In some embodiments, the first layer 210 may include polyester, and the second layer 220 may include epoxy ester. In the embodiment of FIG. 4, a thickness of the first layer 210 may be 3 μm to 8 μm. In some embodiments, a thickness of the second layer 220 may be 5 μm to 10 μm.

Figure 5:
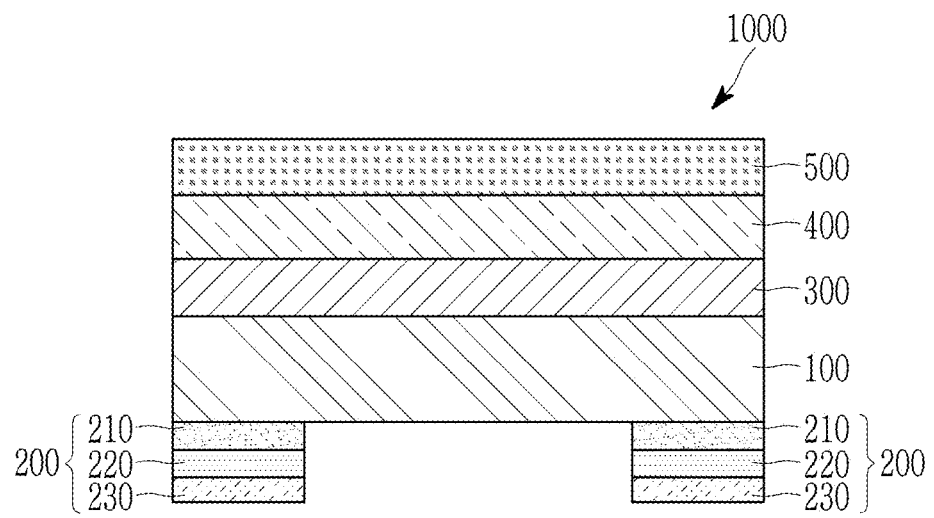
FIG. 5 illustrates a cross-sectional view of a cover window according to another embodiment.

FIG. 5 illustrates a cover window according to another embodiment.

Referring to FIG. 5, the cover window according to the present embodiment is the same as in the embodiment of FIG. 1 except that the light blocking layer 200 includes the first layer 210, the second layer 220, and a third layer 230. Detailed description of the same constituent elements will not be provided.

Referring to FIG. 5, the first layer 210 may include polyester, the second layer 220 may include polyester, and the third layer 230 may include epoxy ester. In this case, a thickness of the first layer 210 may be 2 μm to 5 μm, a thickness of the second layer 220 may be 3 μm to 5 μm, and a thickness of the third layer 230 may be 3 μm to 5 μm.

Figure 6:
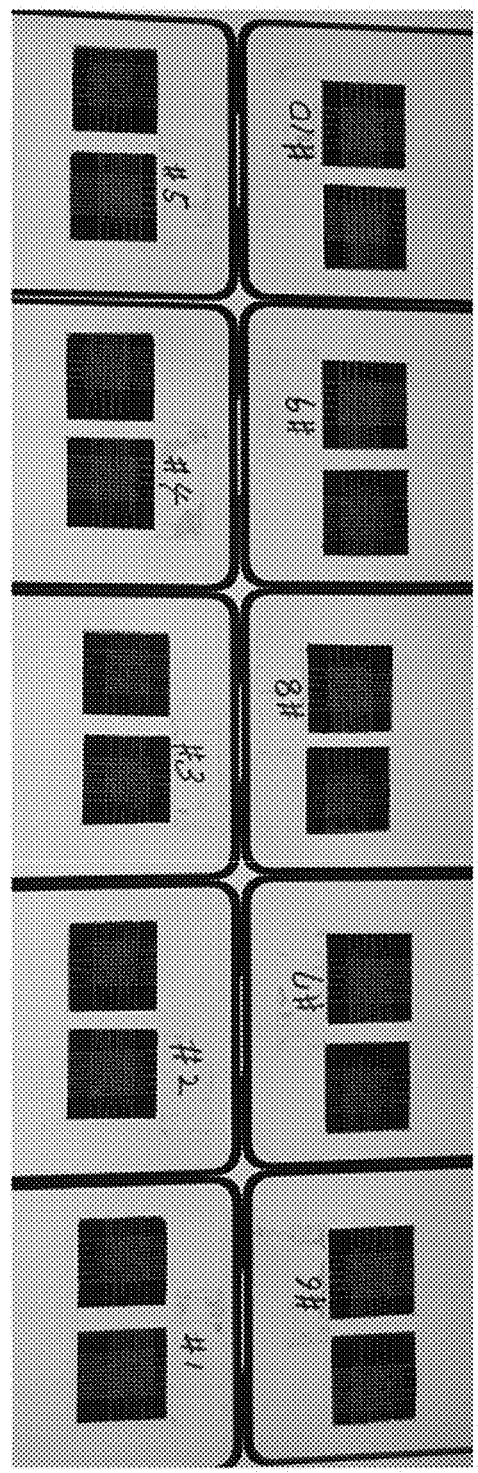
FIG. 6 shows a peeling test result of a light blocking layer.

After the light blocking layer 200 according to the present embodiment was placed in a constant temperature water bath having a temperature of 80° C.±2° C. for 30 minutes, peeling was measured through a tape detachment experiment, and the results are shown in FIG. 6. Referring to FIG.

6, as a result of checking whether peeling before and after hot water immersion in a constant temperature water bath, it was confirmed that all of the peeling tests were excellent or suitable with a level of 4B to 5B (to be explained with reference to FIG. 7).

In the tape detachment test, the peeling was evaluated according to the grading system illustrated in FIG. 7. As shown in FIG. 7, when the peeling test result is at the level of 4B to 5B, it refers to or indicates that the peeled area after tape detachment is within 5% (e.g., less than 5%).

As such, in the cover window according to the present embodiment, because the low refractive layer 300 is a single layer, it is possible to effectively reduce the reflectance of the cover window and increase the durability of the cover window. In some embodiments, because the light blocking layer 200 under the window layer 100 has the suitable heat resistance, the cover window may be formed in one chamber by utilizing the E-beam, thereby simplifying the process. The adhesive layer 400 of the cover window according to the present embodiment allows the low refractive layer 300 containing fluorine to adhere well to the wear resistance layer 500, and the wear resistance layer 500 may allow the cover window to have excellent or suitable wear resistance.

Hereinafter, the physical properties of the cover window according to the present embodiment will be described in more detail with reference to the experimental results.

Table 1 shows the results of measuring physical properties before and after deposition (e.g., E-beam deposition of the low refractive layer, the adhesive layer, and the wear resistance layer) and various physical properties of the cover window (SCI, SCE, Eraser contact angle and Steel wool) manufactured after deposition (e.g., E-beam deposition of the low refractive layer, the adhesive layer, and the wear resistance layer), with respect to the cover window according to the present embodiment.

TABLE 1

| Adhesion (X-Cutting on printed surface before/after deposition/after hot water resistance test) | Color difference ($\Delta E$ on printed surface before/after deposition/after hot water resistance test) | SCI Reflectance (%) | SCE a* | SCE b* | Eraser contact angle (10K) Beginning | 5K | 10K | Steel wool 5K | 10K |
|---|---|---|---|---|---|---|---|---|---|
| All 4B and more | All 0.5 or less | 6.03 | −0.02 | −0.36 | 117.5 | 107.8 | 103.6 | 102.7 | 99.7 |

Referring to Table 1, the degree of peeling of the light blocking layer on the cover window according to this embodiment was measured after a hot water resistance test for 30 minutes in a constant temperature water bath having a temperature of 250° C./before deposition to 80° C.±2° C./after deposition. For example, the degree of peeling was measured on the light blocking layer 1) before deposition of the low refractive layer, the adhesive layer, and the wear resistance layer and after the cover window was placed in a water bath at 80° C.±2° C. for 30 minutes, 2) after deposition but not placed in any water bath, and 3) after deposition and after the cover window was placed in a hot water bath at 250° C. for 30 minutes. In each of the measurements, the peeling result was at 4B or better.

In this case, it was confirmed that the adhesion of the light blocking layer is 4B or more, that is, the peeling area of the total area after tape detachment is within 5%, indicating excellent or suitable adhesion. In some embodiments, the color quality difference ($\Delta E$) of the cover window was measured after the hot water resistance test for 30 minutes in a constant temperature water bath having a temperature of 250° C./before deposition to 80° C.±2° C./after deposition. X-rite Ci 7800 equipment was utilized to measure the color quality difference. In this case, it was confirmed that the measured value was 0.5 or less, indicating that the color deviation was not recognized in appearance. $\Delta E$ values before deposition, after deposition, and after evaluation of hot water resistance at a temperature of 200° C. and 250° C. are shown in FIG. 8.

Figure 8:
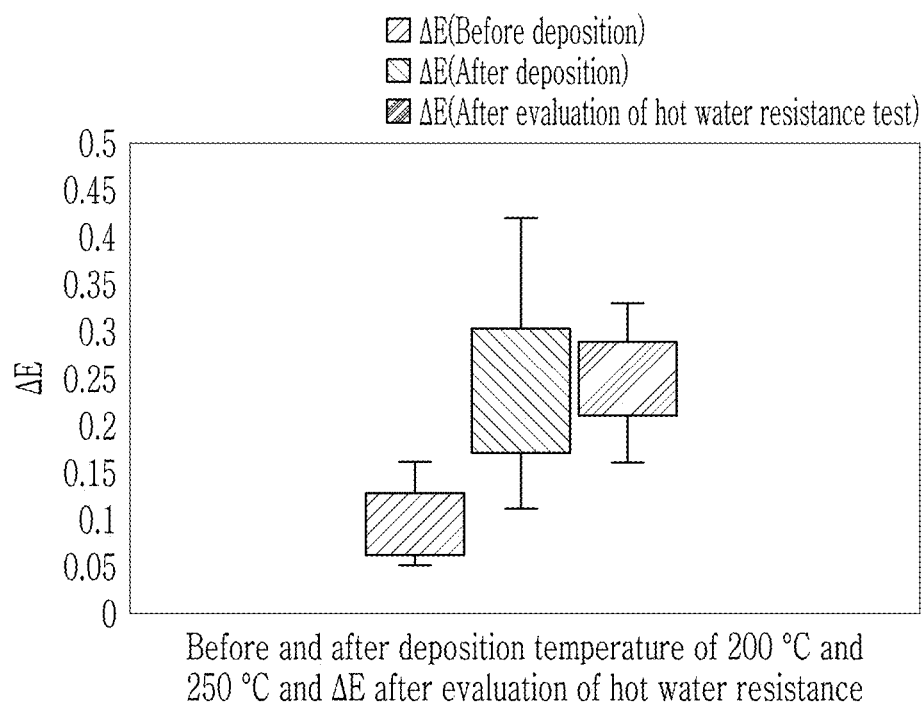
FIG. 8 shows ΔE values before deposition, after deposition, and after evaluation of hot water resistance.

As shown in FIG. 8, it was confirmed that the color quality differences ($\Delta E$) before deposition, after deposition, and after evaluation of hot water resistance were all less than 0.5.

Table 2 shows the results of measuring color quality changes before deposition, after deposition, and after evaluation of hot water resistance by utilizing X-rite Ci 7800 equipment. $\Delta L$, $\Delta a$, $\Delta b$, and $\Delta E$ are values for evaluating color and are values measured by the X-rite Ci 7800 equipment, and the larger the value, the greater the color quality deviation. Referring to Table 2, it was confirmed that the differences in color quality before and after deposition and before and after the hot water resistance test were not significant.

TABLE 2

| | $\Delta L$ | $\Delta a$ | $\Delta b$ | $\Delta E$ |
|---|---|---|---|---|
| Before deposition | 0.001 | −0.002 | 0.009 | 0.091 |
| After deposition | −0.006 | 0.003 | 0.003 | 0.244 |
| After hot water resistance test | 0.003 | −0.003 | 0.248 | 0.251 |

Referring back to Table 1, the reflectance of the cover window according to the present embodiment was 6.03%. In related art, in a display device including a cover window, the reflection by the cover window may be 77% and the reflection by the display panel may be 23%. In this case, when the display panel has a structure that does not include a polarization layer (Pol less), the efficiency of the display panel may increase by 30% or more and the color reproducibility thereof may increase by 10% or more, but the reflectance thereof may also increase. For example, the reflectance of the display panel not including the polarization layer may be increased by 1.2% compared with the display panel including the polarization layer. Accordingly, a related art cover window of the display device not including the polarization layer should have lower reflectance than the cover window of the display device including the polarization layer. Because the reflectance of the cover window of the display device including the polarization layer is typically 8%, the reflectance of the cover window of the display device not including the polarization layer is 6.5% or less.

As shown in Table 1, it was confirmed that the cover window according to this embodiment had a sufficiently low reflectance of 6.03%. Accordingly, the cover window according to the present embodiment may be applied to a display device that does not include a polarization layer, thereby reducing reflectance of the display device.

In some embodiments, referring to Table 1, it was confirmed that a* and b* indicating color quality (SCE) were in a good or suitable range. The color quality (SCE) is a value measured by utilizing the X-rite Ci 7800 equipment as described above, and it is preferable that the color quality of the cover window satisfy $-2<a*<2$ and $-1.5<b*<0.5$. Referring to Table 1, it was confirmed that the color quality (SCE) of the cover window according to the present embodiment satisfied the above-mentioned range.

In some embodiments, referring to Table 1, the wear resistance test utilizing an eraser and steel wool was performed and the results are shown. In this case, the wear resistance test was performed with a load of 1 kg, 40 reciprocations/min, and a stroke of 15 mm, and after being performed 5000 and 10,000 times, respectively, the contact angle (e.g., water contact angle) was measured. The passing standard is that after the number of evaluations, the contact angle is 95° or more and no peeling of the coating is visible in appearance.

Referring to Table 1, in the case of the wear resistance test utilizing an eraser, it was confirmed that the contact angle was 103.6° even after 10,000 times thereof, indicating excellent or suitable wear resistance. Similarly, in the case of the wear resistance test utilizing steel wool, it was confirmed that the contact angle was 99.7° even after 10,000 times thereof, indicating excellent or suitable wear resistance.

Because the light blocking layer 200 of the cover window according to the present embodiment has heat resistance at a temperature of 200° C. to 300° C., it may be manufactured in one chamber, so the process is economical, and the low refractive layer 300 is formed as a single layer, so it is possible to improve durability. In some embodiments, the adhesive layer 400 may include a substitutional solid solution of $SiO_2$ and $Al_2O_3$, so that it is possible to improve adhesion and improve mechanical properties, and to have excellent or suitable wear resistance. As shown in Table 1, because the cover window has a desirable reflectance of 6%, it has excellent or suitable color quality and wear resistance properties.

Figure 9:
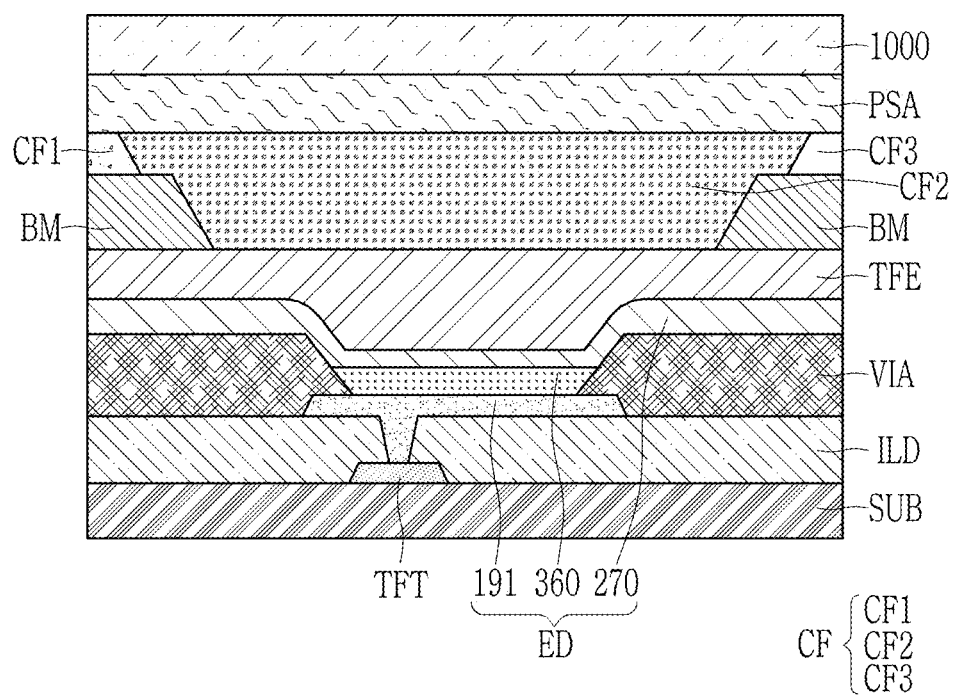
FIG. 9 is a schematic cross-sectional view of a display device including a cover window according to an embodiment.

Hereinafter, a display device including the cover window according to the present embodiment will be briefly described with reference to FIG. 9 as an example. However, the structure shown in FIG. 9 is only an example, and the cover window 1000 may be positioned on a display panel having one or more suitable structures, and is not limited to the structure shown in FIG. 9. FIG. 9 illustrates, for better comprehension and ease of description, a schematic cross-sectional view.

Referring to FIG. 9, a substrate SUB may be positioned (e.g., utilized). The substrate SUB may include glass or polyimide.

A transistor TFT is positioned on the substrate SUB. The transistor TFT may include a gate electrode, a semiconductor layer, a source electrode, a drain electrode, and/or the like, and may be electrically connected to a first electrode 191.

An interlayer insulating film ILD may be positioned on the transistor TFT. The interlayer insulating film ILD may include an inorganic insulating material such as a silicon nitride (SiNx), a silicon oxide (SiOx), and/or a silicon oxynitride (SiOxNy). In some embodiments, the interlayer insulating film ILD may be an organic film. For example, the interlayer insulating film ILD may include an organic insulating material such as a general purpose polymer such as polymethyl methacrylate (PMMA) and/or polystyrene (PS), a polymer derivative having a phenolic group, a acryl-based polymer, an imide-based polymer, a polyimide, and/or a siloxane-based polymer.

An insulating film VIA may be positioned on the first electrode 191. The insulating film VIA may be an organic film. For example, the insulating film VIA may include an organic insulating material such as a general purpose polymer such as polymethyl methacrylate (PMMA) and/or polystyrene (PS), a polymer derivative having a phenolic group, an acryl-based polymer, an imide-based polymer, a polyimide, and/or a siloxane-based polymer.

The insulating film VIA includes an opening overlapping the first electrode 191, and a light emitting element layer 360 may be positioned in the opening of the insulating film VIA. A second electrode 270 may be positioned on the insulating film VIA and the light emitting element layer 360. The first electrode 191, the light emitting element layer 360, and the second electrode 270 may configure (e.g., form) a light emitting element ED.

An encapsulation layer TFE may be positioned on the second electrode 270. The encapsulation layer TFE may have a structure in which an inorganic film and an organic film are alternately stacked, and may protect the light emitting element ED from external moisture and/or contaminants.

A light blocking member BM may be positioned on the encapsulation layer TFE. The light blocking member BM may be positioned in an area that does not overlap the light emitting element layer 360, and overlaps a wire positioned on the substrate (SUB) to prevent or reduce light leakage.

A color filter CF may be positioned on the encapsulation layer TFE. The color filter CF may include a first color filter CF1, a second color filter CF2, and a third color filter CF3.

An adhesive layer PSA may be positioned on the color filter CF. The cover window 1000 may be attached through the adhesive layer PSA. A description of the cover window 1000 will not be provided because it is the same as described above.

As shown in FIG. 9, the display device according to the present embodiment may not include (e.g., may exclude) a polarization layer therein. In this case, efficiency may be increased by 30% or more and color reproducibility may be increased by 10% or more, but reflectance in a related art device may be increased. However, because the cover window 1000 of the display device according to the present embodiment has reflectance of 6.5% or less, it is possible to maintain the reflectance of the display device not including the polarization layer at a level similar to that of the display device including the polarization layer. Therefore, efficiency may be improved and color reproducibility may be improved without increasing the reflectance.

As used herein, expressions such as "at least one of", "one of", and "selected from", when preceding a list of elements, modify the entire list of elements and do not modify the individual elements of the list. For example, "at least one of a, b or c" may indicate only a, only b, only c, both (e.g., simultaneously) a and b, both (e.g., simultaneously) a and c, both (e.g., simultaneously) b and c, all of a, b, and c, or variations thereof.

The use of "may" when describing embodiments of the present invention refers to "one or more embodiments of the present invention."

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The display device and/or any other relevant devices or components according to embodiments of the present invention described herein may be implemented utilizing any suitable hardware, firmware (e.g. an application-specific integrated circuit), software, or a combination of software, firmware, and hardware. For example, the various components of the device may be formed on one integrated circuit (IC) chip or on separate IC chips. Further, the various components of the device may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the embodiments of the present invention.

While the present disclosure has been described in connection with what is presently considered to be practical embodiments, it is to be understood that the present disclosure is not limited to the disclosed embodiments, but, on the contrary, is intended to cover one or more suitable modifications and equivalent arrangements included within the spirit and scope of the appended claims, and equivalents thereof.

| Description of symbols | |
|---|---|
| 1000: cover window | 100: window layer |
| 200: light blocking layer | 210: first layer |
| 220: second layer | 230: third layer |
| 300: low refractive layer | 400: adhesive layer |
| 500: wear resistance layer | |

What is claimed is:

1. A cover window comprising:
a window layer;
a low refractive layer on a first surface of the window layer;
an adhesive layer on the low refractive layer;
a wear resistance layer on the adhesive layer; and
a light blocking layer on a second surface of the window layer facing oppositely away from the first surface,
wherein the adhesive layer comprises a substitutional solid solution of $SiO_2$ and $Al_2O_3$.

2. The cover window of claim 1, wherein the low refractive layer is a single layer.

3. The cover window of claim 2, wherein the low refractive layer comprises $MgF_2$.

4. The cover window of claim 3, wherein the $MgF_2$ in the low refractive layer has a crystalline structure.

5. The cover window of claim 2, wherein a thickness of the low refractive layer is 50 nm to 150 nm.

6. The cover window of claim 2, wherein a refractive index of the low refractive layer at a wavelength of 550 nm is 1.5 or less.

7. The cover window of claim 1, wherein the adhesive layer comprises $Si_9Al_2O_{10}$.

8. The cover window of claim 1, wherein a thickness of the adhesive layer is 5 nm to 25 nm.

9. The cover window of claim 1, wherein a refractive index of the adhesive layer at a wavelength of 550 nm is 1.5 or less.

10. The cover window of claim 1, wherein the wear resistance layer comprises perfluoropolyether.

11. The cover window of claim 1, wherein a thickness of the wear resistance layer is 5 nm to 30 nm.

12. The cover window of claim 1, wherein the light blocking layer has a single-layered or multi-layered structure, and comprises at least one of acrylic urethane, epoxy, polyester, or epoxy ester.

13. The cover window of claim 1, wherein a thickness of the light blocking layer is 8 μm to 15 μm.

14. The cover window of claim 1, wherein the light blocking layer comprises a first layer comprising acrylic urethane and a second layer comprising epoxy, a thickness of the first layer is 3 μm to 8 μm, and a thickness of the second layer is 5 μm to 10 μm.

15. The cover window of claim 1, wherein the light blocking layer comprises a first layer comprising polyester and a second layer comprising an epoxy ester, a thickness of the first layer is 3 μm to 8 μm, and a thickness of the second layer is 5 μm to 10 μm.

16. The cover window of claim 1, wherein the light blocking layer comprises a first layer comprising polyester, a second layer comprising polyester, and a third layer comprising epoxy ester,
a thickness of the first layer is 2 μm to 5 μm,
a thickness of the second layer is 3 μm to 5 μm, and
a thickness of the third layer is 3 μm to 5 μm.

17. The cover window of claim 1, wherein
the light blocking layer is only in a partial area of the window layer.
18. The cover window of claim 1, wherein
the light blocking layer has heat resistance at a temperature of 200° C. to 300° C.
19. The cover window of claim 1, wherein
a reflectance of the cover window is 6.5% or less.
20. A display device comprising:
the cover window of claim 1; and
a display panel overlapping the cover window.

\* \* \* \* \*